United States Patent [19]
Banach

[11] 3,872,387
[45] Mar. 18, 1975

[54] FREQUENCY RESPONSE MODIFIER FOR FIXED-TUNED IF AMPLIFIERS

[75] Inventor: Frank G. Banach, Oak Lawn, Ill.

[73] Assignee: Zenith Radio Corporation, Chicago, Ill.

[22] Filed: Sept. 29, 1972

[21] Appl. No.: 293,611

[52] U.S. Cl. ........... 325/427, 178/DIG. 19, 325/489
[51] Int. Cl. ............................................. H04b 1/16
[58] Field of Search ........... 325/330, 331, 427, 488, 325/489, 490, 344, 387, 400, 401; 178/DIG. 19, 5.8 A; 333/17, 18 R; 330/31

[56] References Cited

UNITED STATES PATENTS

| | | | |
|---|---|---|---|
| 3,025,343 | 3/1962 | Waring | 178/DIG. 19 |
| 3,108,225 | 10/1963 | Midkiff | 325/387 |
| 3,447,084 | 5/1969 | Haner et al. | 325/421 X |
| 3,510,580 | 5/1970 | Okano | 178/DIG. 19 |
| 3,582,540 | 6/1971 | Adler | 178/5.4 R |

*Primary Examiner*—Benedict V. Safourek
*Attorney, Agent, or Firm*—Nicholas A. Camasto; John H. Coult; John J. Pederson

[57] ABSTRACT

This disclosure depicts methods and apparatus for effectively varying the frequency response of a television IF amplifier whose selectivity is determined by non-variable tuning elements such as SWIFs (surface wave integratable filters). Specifically, a variable bandwidth means, capable of exhibiting either a narrow-band or wide-band frequency response, is coupled to the output of the fixed-tuned IF amplifier. This variable bandwidth means is responsive to a control voltage for selecting one of the frequency response characteristics to be cascaded with the fixed response of the IF amplifier. The selection of the wide-band response allows the overall frequency response characteristic to remain essentially that of the fixed-tuned IF amplifier itself; the selection of the narrow-band response causes the overall frequency response characteristic to be changed to an extent dependent on the selectivity of the narrow-band response.

7 Claims, 7 Drawing Figures

FREQUENCY RESPONSE MODIFIER FOR FIXED-TUNED IF AMPLIFIERS

BACKGROUND OF THE INVENTION

This invention pertains to television receivers. In particular it pertains to a means for altering the frequency response of a television IF (intermediate frequency) amplifier whose frequency response is determined by non-variable tuning elements such as SWIFs (surface wave integratable filters).

The use of SWIFs as tuning elements in television IF amplifiers is illustrated in U.S. Pat. No. 3,582,838, issued to A. DeVries and assigned to the assignee of the present invention.

Basically, a SWIF is an acoustic surface wave device comprising a piezoelectric medium propagative of acoustic surface waves, an input transducer coupled to the medium for receiving an input signal and for generating and interacting with acoustic surface waves, and one or more output transducers also coupled to the medium for receiving and interacting with the same acoustic surface waves. An electrical output is generated by the interaction of the output transducer(s) with the propagating acoustic surface waves. By appropriate selection of the medium material and the design of the transducers, a wide variety of different frequency selectivity characteristics may be obtained. One or more SWIFs can be connected to the signal transmission path to provide the desired selectivity.

These acoustic wave devices can be fabricated by integrated circuit technology so that the entire tuning system of an IF amplifier can be realized on a small rigid piezoelectric substrate. Because of their small size and method of fabrication, SWIFs lend themselves admirably to use in solid state environments, particularly in conjunction with integrated circuit systems.

The characteristics of SWIFs which make their use in IF amplifiers desirable also impose certain limitations on their use. Their ability to be mass-produced in accordance with integrated circuit technology and the fact that their fixed geometry characterizes a fixed predetermined frequency response offer obvious advantages. Coupled with their advantages is a definite limitation: the frequency response of an IF amplifier in which SWIFs determine the frequency selectivity cannot be readily altered.

It is desirable to alter the frequency response of the IF amplifier, for example, under weak signal strength conditions. Normally the picture carrier is positioned on the slope of the IF bandpass curve at a point which is 6DB down from the peak response; however, when the signal strength at the antenna drops to the level of approximately 25 microvolts, it is desirable to adjust the frequency response of the IF amplifier so that the picture carrier is positioned at the peak of the IF response curve. This procedure effectively doubles the gain of the IF amplifier at the frequency of the picture carrier. Were it not for the action of the AGC (automatic gain control) system, found on all commercial television receivers, the amplitude of the detected video signal would be doubled. The AGC system responds to this attempt to double the amplitude of the detected video signal by reducing the gain of the tuner by one-half. This maintains the amplitude of the detected video signal at its preselected level.

This reduction in tuner gain lowers the level of the tuner output signal for all frequency components thereof by one-half, including noise components. Since the gain of the IF amplifier was doubled only for frequency components at or near the IF picture carrier frequency, the net effect is to double the gain of the tuner/IF combination for frequency components near the picture carrier relative to all other frequency components passed by the tuner. The result is an improvement in the signal to noise ratio of the detected picture carrier.

Prior art methods of accomplishing this change in an IF frequency response rely on an ability to alter the tuning of elements within and forming an integral part of the IF amplifier. In a typical solid state IF amplifier, the output impedance of a transistor amplifier is made to change in response to the varying AGC voltage applied to it. This variation in the output impedance is then used to alter the tuning of a tank circuit so as to position the picture carrier closer to the peak of the IF response curve. An example which illustrates this practice can be found in U.S. Pat. No. 3,495,031, issued to R. Poppa, and asigned to the assignee of this invention.

Because the frequency response of an IF amplifier constructed of fixed geometry SWIFs cannot be altered by the methods taught in the prior art, resort must be had to a new and different approach to the problem.

OBJECTS OF THE INVENTION

It is a general object of this invention to provide for use in a television receiver method and means for effectively altering the frequency response characteristics of IF amplifiers having non-variable tuning elements.

It is another object of this invention to provide method and means for effectively altering the frequency response characteristics of such IF amplifiers so that the picture carrier is positioned at the peak of the frequency response characteristic during weak signal conditions.

BRIEF DESCRIPTION OF THE DRAWINGS

The features of this invention which are believed to be new are set forth with particularity in the appended claims. The invention, together with further objects and advantages thereof, may be best understood by reference to the following description in conjunction with the accompanying drawings in which like numbers refer to like elements and in which:

DESCRIPTION OF THE PREFERRED EMBODIMENT

Figure 1:
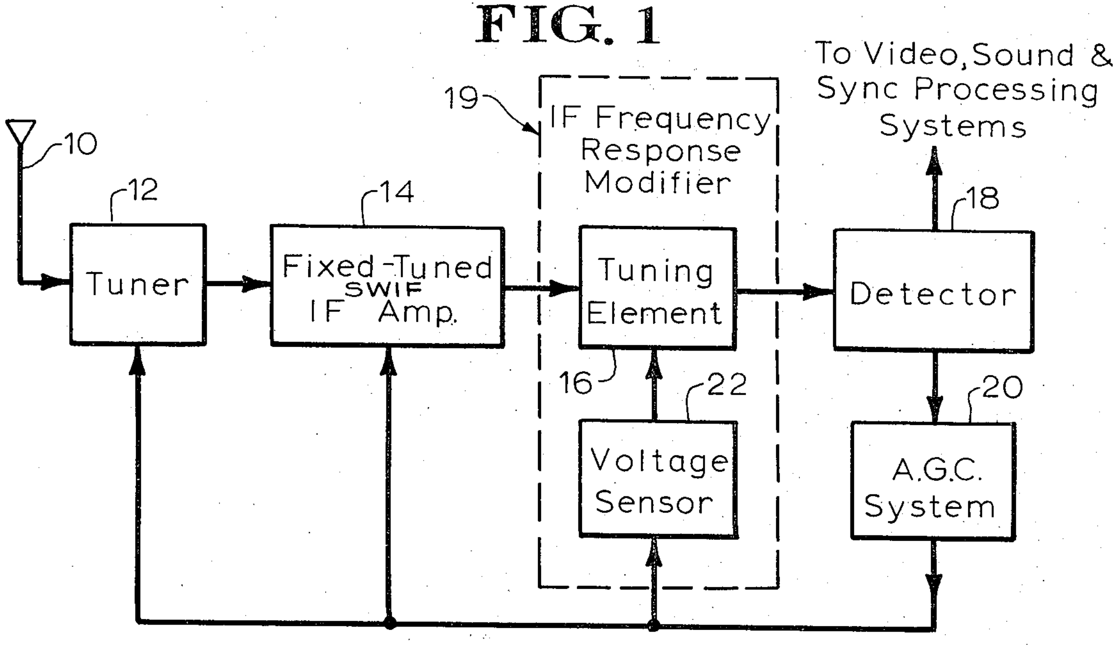
FIG. 1 is a partial block diagram of a television receiver including an IF frequency response modifier which illustrates one structure for implementing the principles of this invention.

FIG. 1 is a partial block diagram of a television receiver having an antenna 10 coupled to a tuner 12 for receiving and selectively converting certain preselected RF television signals to a lower predetermined IF frequency. The IF signal appearing at the output of tuner 12 is coupled to a fixed-tuned IF amplifier 14 having a selective frequency response designed to reject unwanted signals while amplifying the desired frequency components of the IF signal. In this case, the frequency response of IF amplifier 14 is determined solely by non-variable or fixed tuning elements such as SWIFs U.S. Pat. Nos. 3,550,045, 3,582,838, assigned to the assignee of this invention, describe SWIF structures suitable for determining the IF bandpass characteristics of amplifier 14.

The amplified IF signal developed in amplifier 14 is coupled to video and sound detector 18 via a tuning element 16 which is part of a novel frequency response modifier 19 to be discussed in detail below. The detected composite video signal appearing at the output of detector 18 is then coupled to AGC system 20 and to appropriate video, sound and sync processing systems (not shown) which may be of conventional construction.

AGC system 20 generates an AGC voltage which is applied to tuner 12 and IF amplifier 14 for controlling their respective gains in a manner well known in the art. In addition, this AGC voltage is coupled to a voltage sensor 22 forming a second component of the novel frequency response modifier 19. The sensor 22 senses the amplitude of the applied AGC voltage and responds to predetermined amplitude levels thereof by altering the frequency response of tuning element 16 in a predetermined manner, all as described at length below.

AGC system 20 responds to various amplitudes of the composite video signal at its input by generating an AGC voltage whose amplitude corresponds to that of the applied video signal. When the amplitude of the video signal drops below a predetermined level, the AGC system adjusts the level of its output voltage in a direction which causes the gain of the tuner 12 and IF amplifier 14 to increase. Similarly, an increase in the amplitude of the video signal applied to AGC system 20 will result in an AGC voltage which tends to decrease the gain of tuner 12 and IF amplifier 14. The AGC voltage is thus an indicator of the strength of the television signal received by antenna 10.

In accordance with the principles of this invention, when the received signal strength is relatively large, a level of AGC voltage is developed in response to which voltage sensor 22 causes tuning element 16 to exhibit a relatively broad frequency response over the IF frequency range. Because the frequency response characteristics of tuning element 16 and IF amplifier 14 are cascaded and because the frequency response of the IF amplifier 14 is much more selective than that of tuning element 16, their overall frequency response will be determined primarily by IF amplifier 14.

However, when the signal strength at antenna 10 drops to a predetermined low level, the corresponding AGC voltage and the response of voltage sensor 22 will cause the frequency response of tuning element 16 to become more selective or narrowband over the IF frequency range. In this situation the more selective frequency response of tuning element 16 and the fixed frequency response of IF amplifier 14 together produce an overall frequency response determined by their combined characteristics.

Figure 2A:
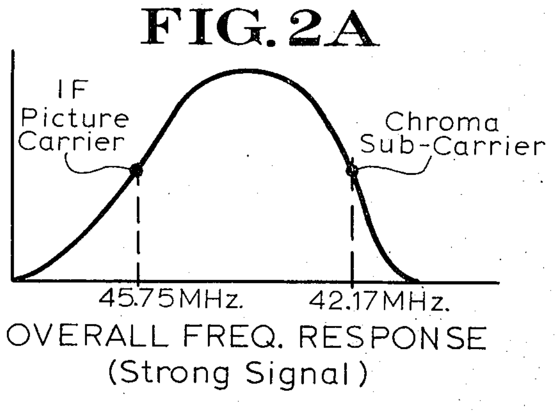
FIG. 2A–2D depict the general nature of certain frequency response curves associated with certain elements of FIG. 1.
Figure 2B:
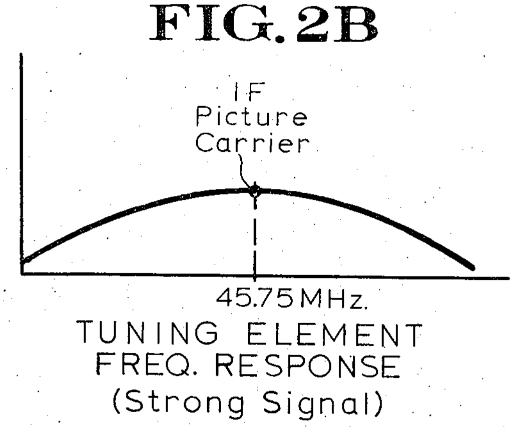

The preceding sequence of events can be more easily understood by reference to FIGS. 2A–2D. FIG. 2A characterizes an overall response curve normally associated with an IF amplifier when a relatively strong signal is present at the antenna. The frequency of the picture carrier is positioned approximately 6DB down from the peak of the curve. The curve of FIG. 2A is very similar to that which would be associated with IF amplifier 14 alone. FIG. 2B illustrates the frequency response of tuning element 16 for the same conditions; its response is made so broad over the frequency range of interest that, when cascaded with the fixed frequency response of IF amplifier 14, the overall frequency response remains essentially that of IF amplifier 14, as shown in FIG. 2A.

Figure 2C:
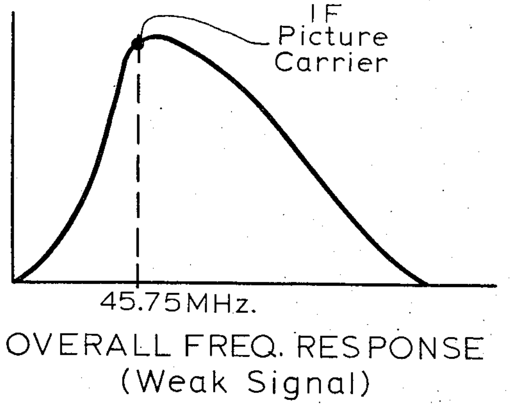
Figure 2D:
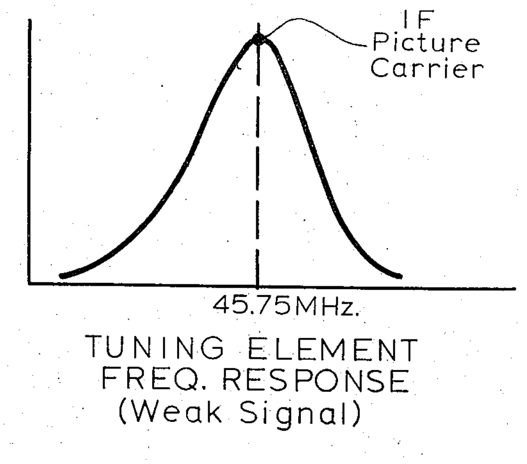

FIG. 2C illustrates the desired overall frequency response of IF amplifier 14 and tuning element 16 for a weak signal strength. Note that the frequency of the picture carrier is now positioned at the peak of the overall response curve. This change in the overall frequency response is caused by the described change in the frequency response of tuning element 16 according to the principles of the invention. FIG. 2D shows the increased selectivity associated with tuning element 16 when the signal strength is low.

The overall frequency response shown in FIG. 2C, desirable for relatively weak signal strength conditions, has been obtained by cascading the weak signal strength frequency response of tuning element 16 (FIG. 2D) with the fixed frequency response of IF amplifier 14 (FIG. 2A). This alteration in the overall frequency response results in a picture carrier at the video detector 18 having a signal-to-noise ratio which is improved by at least a factor of 2. This becomes evident by comparing FIG. 2A and 2C and noting that the relative gain of the overall IF system has been increased by 6DB (a voltage gain of 2) at the frequency of the picture carrier. The end result of this increased gain at the frequency of the picture carrier is a reproduced image having less noise or snow during conditions of weak signal strength.

Figure 3:
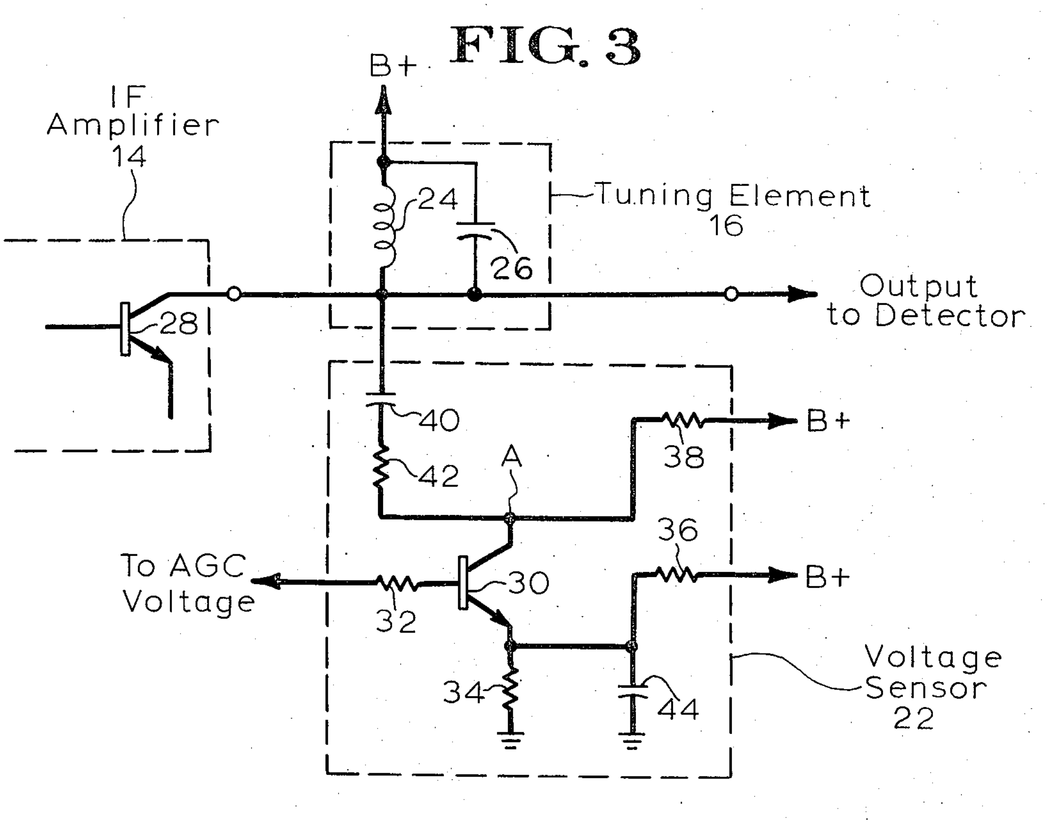
FIG. 3 is a schematic diagram which illustrates a preferred embodiment of the frequency response modifier shown in FIG. 1.

Structures for carrying out the above-described overall frequency response modification according to this invention will now be described in detail. FIG. 3 illustrates a preferred embodiment of the novel frequency response modifier 19 shown in FIG. 1 and described above very briefly. Tuning element 16 is shown as comprising a tuned circuit formed by a coil 24 and a capacitor 26. A transistor 28 is the output transistor of IF amplifier 14 and includes in its collector load the coil 24 and capacitor 26. The values of coil 24 and capacitor 26 are chosen to establish a condition of antiresonance at or near the frequency of the picture carrier.

The voltage sensor 22 is shown as including a transistor 30, is biasing resistors 32, 34 and 36, a collector resistor 38, a coupling capacitor 40, and a damping resistor 42.

In operation, biasing resistors 32, 34 and 36 are chosen so that transistor 30 is normally in a state of conduction for the levels of AGC voltage which correspond to relatively great signal strengths. Collector resistor 38 is chosen to be of a high enough resistance so that transistor 30 saturates under these conditions. Because capacitor 44 effectively bypasses resistor 34 at the frequencies of interest, a condition of saturation of transistor 30 will insure that point A is effectively at AC ground. With an AC ground established at point A, damping resistor 42 is effectively placed in parallel with coil 24. This has the effect of lowering the Q of the tuned circuit and broadening its frequency response. In practice it has been found that a value for resistor 42 which will effectively produce a Q of 2 for the tuned circuit produces a sufficiently broad response.

Under the conditions described above the frequency response of the tuned circuit formed by coil 24, capacitor 26, and damping resistor 42 is similar to that shown by the curve of FIG. 2B.

When the signal strength at the antenna drops to a predetermined relatively low level, the AGC voltage applied to transistor 30 will also drop to a predetermined level effective to extinguish conduction in that transistor. In this situation point A is at a relatively high impedance level, and the impedance in parallel with coil 24 includes not only resistor 42 above, but rather of the series combination of resistor 42 and collector resistor 38. By choosing the resistance value of collector resistor 38 to be much greater than the resistance value of damping resistor 42, the effective resistance across coil 24 is greatly increased. As a result of this much larger resistance in parallel with coil 24, the Q of the tuned circuit, and therefore its selectivity, is greatly increased. FIG. 2D illustrates the more selective frequency response of the tuned circuit under these conditions.

To briefly summarize the operation of the FIG. 3 circuit: the AGC voltage developed in response to a preselected signal having a relatively great signal strength is of a sufficient amplitude to cause transistor 30 to be in a state of saturation, thereby placing damping resistor 42 across the tuned circuit and broadening its response in the manner described above. When the signal strength drops to a predetermined point below which the AGC voltage is unable to sustain conduction in transistor 30, a much larger resistance composed of resistors 42 and 38 is placed in parallel with the tuned circuit. This causes the tuned circuit to exhibit a much more selective or narrow-band frequency response.

Figure 4:
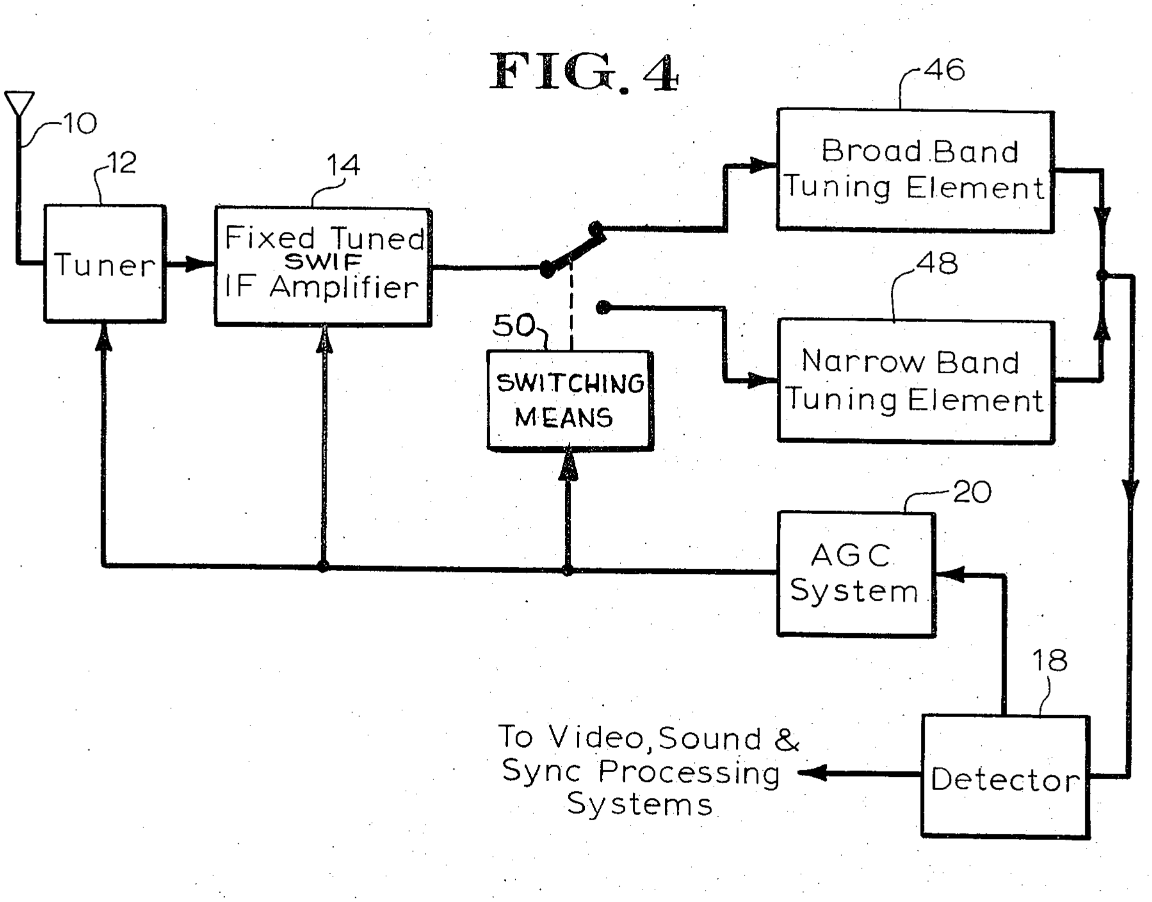
FIG. 4 illustrates in block diagram form an alternative embodiment to that of FIG. 1 which also implements the principles and objects of this invention.

The system shown in FIG. 4 is an alternate to that of FIG. 1. In FIG. 4 the overall frequency response is altered by placing in series with fixed-tuned IF amplifier 14 either a broad-band tuning element 46 or a narrow-band tuning element 48, rather than altering the frequency response of a single tuning element as described above. Switching means 50 responds to a variable amplitude control signal, here shown again as an AGC signal. When the level of the AGC signal indicates relatively low signal strengths at the antenna, the output of IF amplifier 14 is connected to the input of narrow-band tuning element 48. The frequency response characteristic of tuning element 48 is essentially as shown in FIG. 2D. The overall frequency response characteristic then resembles that shown in FIG. 2C.

When the signal strength at the antenna increases to a predetermined relatively high level, switching means 50 responds to the changing AGC voltage by switching the IF signal from narrow-band tuning element 48 to broad-band tuning element 46. The frequency response characteristic of broad-band tuning element 46 is preferably caused to be similar to that shown in FIG. 2B, in which case the overall frequency response characteristic will resemble that shown in FIG. 2A.

While the invention has been described in conjunction with specific embodiments thereof, it is evident that many other alternatives, modifications, and variations will be apparent to those skilled in the art in the light of the foregoing invention. For example, in certain applications it may be preferable to couple the IF frequency response modifier 19 to the input of IF amplifier 14 rather than to its output. Another modification of the embodiments shown herein which may be desirable is the use of variable amplitude control signal other than the AGC signal for actuating the frequency response modifier. Such a signal could even be derived from a manually adjustable voltage as opposed to the automatic AGC voltage described herein. Accordingly, it is intended to embrace all such alternatives, modifications, and variations which fall within the spirit and scope of the appended claims.

I claim:

1. In a television receiver having a fixed-tuned IF amplifier with an IF frequency response characteristic determined by a surface wave integratable filter for selectively amplifying a range of intermediate frequency components of a received television signal associated with a plurality of intermediate frequency carriers therein, a frequency response modifier, comprising:

variable bandwidth means coupled to the output of the fixed-tuned IF amplifier and having no frequency response characteristics, the first of said frequency response characteristics being relatively non-selective and wide-band over the IF frequency range and the second of said frequency response characteristics being relatively more narrow-band with a peak in its frequency response curve at or near the frequency of one of said plurality of intermediate carriers;

means for generating a variable control signal; and selector means responsive to predetermined amplitude levels of said control signal for selecting and cascading with said fixed-tuned IF amplifier one of said frequency response characteristics associated with said variable bandwidth means, said wide-band frequency response being selected in response to a first predetermined level of the control signal and said narrowband frequency response being selected in response to a second predetermined level of said control signal.

2. A frequency response modifier as defined in claim 1 wherein said control signal consists of an AGC voltage developed in the television receiver.

3. A frequency response modifier as defined in claim 2 wherein said selector means includes means responsive to predetermined amplitude levels in said AGC voltage for causing the wide-band frequency response of said variable bandwidth means to be cascaded with the frequency response of said fixed-tuned IF amplifier for AGC voltage levels corresponding to a relatively great signal strength in the received television signal and for causing the narrow-band frequency response of said variable bandwidth means to be cascaded with the frequency response of said fixed-tuned IF amplifier for AGC levels corresponding to a relatively weak signal strength in the received television signal.

4. A frequency response modifier as in claim 3 wherein said variable bandwidth means include two independent fixed bandwidth elements to be alternatively coupled to the output of the fixed-tuned IF amplifier in response to appropriate selection by said voltage sensing means, the first element having a wide bandwidth over the IF frequency range and the second element having both a relatively narrow bandwidth and a peak in its frequency response curve at or near the frequency of the IF picture carrier.

5. A frequency response modifier as in claim 3 wherein said variable bandwidth means includes a tuned circuit exhibiting a condition of antiresonance at or near the frequency of the IF picture carrier and means for damping said tuned circuit with a low or high value resistance in response to predetermined amplitude levels of the AGC voltage, thereby causing said tuned circuit to exhibit a wide-band or narrow-band frequency response according to the level of said AGC voltage.

6. In a television receiver having a fixed-tuned IF amplifier for selectively amplifying certain predetermined frequency components of a received television signal, the combination comprising:

an IF stage including an amplifier and surface wave filter means for determining the frequency response thereof;

variable bandwidth means exhibiting a condition of antiresonance at or near the frequency of the If picture carrier and coupled to the IF stage;

means for generating a variable AGC signal whose amplitude corresponds to the strength of the received television signal; and voltage sensing means responsive to said AGC signal and coupled to said variable bandwidth means for causing said variable bandwidth means to exhibit a relatively wide-band frequency response over the IF frequency range when the amplitude of said AGC signal corresponds to a relatively great signal strength in the received television signal, and for causing said element to exhibit a more narrow-band response with a peak in its frequency response curve in the vicinity of the IF picture carrier frequency when the amplitude of said AGC signal corresponds to a relatively weak signal strength in the received television signal, thereby causing the cascaded frequency response of the fixed-tuned IF stage and the variable bandwidth means to change in response to changes in the amplitude of the AGC signal and the corresponding variations in the signal strength of the received television signal.

7. A frequency response modifier as in claim 6 wherein said variable bandwidth means consists of a parallel tuned circuit, and wherein said voltage sensing means includes a transistor in a common emitter configuration whose base is coupled to said control signal and whose collector is coupled to said parallel tuned circuit, the transistor being so biased as to be in a state of conduction at a predetermined amplitude of said control signal so as to load said tuned circuit with the relatively low output impedance of said transistor and thereby lower its Q, and to be in a state of non-conduction at another predetermined amplitude of said control signal, thereby presenting a relatively high output impedance to the tuned circuit and causing its Q to be at a preselected higher level.

* * * * *

UNITED STATES PATENT OFFICE
CERTIFICATE OF CORRECTION

Patent No. 3,872,387 Dated March 18, 1975

Inventor(s) Frank G. Banach

It is certified that error appears in the above-identified patent and that said Letters Patent are hereby corrected as shown below:

column 6, line 20, delete "no" and insert --two--.

Signed and sealed this 27th day of May 1975.

(SEAL)
Attest:

RUTH C. MASON
Attesting Officer

C. MARSHALL DANN
Commissioner of Patents
and Trademarks